(12) United States Patent
Chuman et al.

(10) Patent No.: US 8,049,404 B2
(45) Date of Patent: Nov. 1, 2011

(54) ORGANIC ELECTROLUMINESCENT DISPLAY PANEL AND MANUFACTURING METHOD THEREOF

(75) Inventors: Takashi Chuman, Tsurugashima (JP); Satoru Ohta, Tsurugashima (JP); Chihiro Harada, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 654 days.

(21) Appl. No.: 12/294,638

(22) PCT Filed: Mar. 28, 2007

(86) PCT No.: PCT/JP2007/056700
§ 371 (c)(1),
(2), (4) Date: Sep. 26, 2008

(87) PCT Pub. No.: WO2007/111352
PCT Pub. Date: Oct. 4, 2007

(65) Prior Publication Data
US 2010/0238142 A1 Sep. 23, 2010

(30) Foreign Application Priority Data
Mar. 29, 2006 (JP) .................................. 2006-091069

(51) Int. Cl.
*H01J 1/62* (2006.01)
*H01J 63/04* (2006.01)
*G09G 3/32* (2006.01)

(52) U.S. Cl. ........ 313/503; 313/498; 313/504; 313/506; 313/509

(58) Field of Classification Search .................. 313/483, 313/498, 503, 504, 505, 506, 509; 315/160, 315/169.1, 169.3; 345/55, 76, 80, 82, 83, 345/84, 87, 88
See application file for complete search history.

(56) References Cited

U.S. PATENT DOCUMENTS

| | | | | |
|---|---|---|---|---|
| 7,223,147 | B2 * | 5/2007 | Kobayashi | 445/24 |
| 7,501,754 | B2 * | 3/2009 | Funamoto et al. | 313/504 |
| 7,573,191 | B2 * | 8/2009 | Kobayashi | 313/503 |
| 2004/0119406 | A1 * | 6/2004 | Kobayashi | 313/506 |
| 2005/0269947 | A1 * | 12/2005 | Kobayashi | 313/504 |
| 2005/0285509 | A1 * | 12/2005 | Funamoto et al. | 313/504 |

FOREIGN PATENT DOCUMENTS

| | | |
|---|---|---|
| EP | 1 209 744 | 5/2002 |
| JP | 2002-15866 | 1/2002 |
| JP | 2002-252083 | 9/2002 |

(Continued)

*Primary Examiner* — My-Chau T Tran
(74) *Attorney, Agent, or Firm* — Drinker Biddle & Reath LLP

(57) ABSTRACT

An active matrix drive organic EL display panel comprising an organic TFT with a configuration that prevents the occurrence of current leak, and a manufacturing method thereof are proposed. The organic EL display panel comprises: a substrate; an organic EL element comprising in order from the substrate, a first display electrode, an organic functional layer and a second display electrode; and an organic TFT for driving and controlling the organic EL element comprising in order from the substrate a gate electrode, a gate insulation film, source/drain electrodes, and an organic semiconductor layer. The organic EL display panel further comprises: a first bank having a first window section for demarcating a light emitting region on which the organic functional layer is provided on the first display electrode and a second window section demarcating a transistor region on which the organic semiconductor layer is provided between the source/drain electrodes; and a second bank located in the perimeter of the second window section and protruding in a direction that intersects with the main surface of the substrate.

9 Claims, 16 Drawing Sheets

FOREIGN PATENT DOCUMENTS

| | | |
|---|---|---|
| JP | 2002-343578 | 11/2002 |
| JP | 2002-359374 | 12/2002 |
| JP | 2004-103334 | 4/2004 |
| JP | 2004-247058 | 9/2004 |
| JP | 2005-522000 | 7/2005 |
| JP | 2006-133573 | 5/2006 |
| JP | 2007-19014 | 1/2007 |
| TW | 541847 | 7/2003 |

* cited by examiner

ORGANIC ELECTROLUMINESCENT DISPLAY PANEL AND MANUFACTURING METHOD THEREOF

TECHNICAL FIELD

The present invention relates to an organic electroluminescent display panel with an active matrix drive system, and to a manufacturing method thereof.

BACKGROUND ART

Organic electroluminescence display devices (hereinafter referred to as organic EL display devices) preferably have a display with an active matrix drive system in order to achieve screen brightness uniformity and screen rewrite speed. These displays are comprised of an emission unit comprising organic electroluminescent elements (hereinafter referred to as organic EL elements) in each pixel and a drive unit comprising thin-film transistors (hereinafter referred to as TFT).

The organic EL element comprises in order from above the substrate, a first display electrode, an organic functional layer including a light emitting layer, and a second display electrode.

Furthermore, the TFT normally comprises in order a gate electrode made of a thin metal film formed on a glass substrate, a gate insulation layer that covers the gate electrode, a pair of source/drain electrodes separated from and facing towards the gate insulation layer, and a semiconductor layer which forms a channel between the source and drain electrodes. The semiconductor layer comprises inorganic materials such as a-Si (amorphous silicon) and p-Si (polysilicon) and the like.

Organic EL display devices which use a TFT of this construction are normally manufactured using a thin film forming process which requires high temperature processing and vacuum equipment such as CVD (chemical vapor deposition) or sputtering, in addition to a high precision photolithography process. Therefore the burden of equipment costs and running costs is extremely high.

Therefore research and development into organic thin-film transistors (hereinafter referred to as organic TFT) which use a semiconductor layer made of organic compounds has been performed (see Patent document 1). When manufacturing an organic TFT, the method for forming the organic semiconductor layer generally uses a vacuum vapor deposition method if the organic compound of the semiconductor layer is a low molecular weight material, and uses a printing method if high molecular weight materials are used. However, the merits of using organic materials in the semiconductor layer of the transistor are (1) creating a vacuum condition is not required when manufacturing the semiconductor layer, and (2) the semiconductor layer can be manufactured at low processing temperatures so a resin substrate can be used, and in order to be able to take full advantage of these merits, printing methods have been attempted in order to manufacture organic TFT. One of these manufacturing methods is the inkjet method.

The inkjet method sprays very fine droplets containing organic material that form an organic semiconductor layer from fine nozzles toward the coating subject while controlling with an electric signal, in order to form a thin film with the desired shape. Note, the coating subject has the desired shape and has a preformed water repellent bank with an opening corresponding to the shape of the organic TFT semiconductor layer, and the droplets which are sprayed towards this opening are repelled by this bank and are arranged inside the opening.

Patent Document Japanese Patent Kokai No. 2002-343578

DISCLOSURE OF THE INVENTION

Problem to be Solved by the Invention

Because the organic functional layer of organic EL elements can also be formed using the inkjet method, an attempt was made to manufacture an organic electroluminescent display panel (hereinafter referred to as organic EL display panel) that comprises organic TFT of a construction as described above by forming a bank to demarcate the region that contains the organic functional layer and then forming the organic EL element. This research also attempted to manufacture both the bank that demarcates the range of the organic semiconductor layer of the organic TFT and the bank that demarcates the range of the organic functional layer of the organic EL element using the same process. When the banks are formed in the same process, after the banks are formed, the organic semiconductor layer for the organic TFT is formed and then the organic functional layer for the organic EL element is formed, then the second display electrode is formed using a vapor deposition method, and the organic EL display panel is formed. However, with an organic EL display panel obtained by this process, the second display electrode of the organic EL element can come in contact with the organic semiconductor layer of the organic TFT, and as a result, there is a possibility that current will leak and flow from the source/drain electrode to the second display electrode.

An object of the present invention is to provide means for resolving various problems, of which one example is the aforementioned problem.

Means for Solving the Problem

The organic EL display panel described in claim 1 comprises: a substrate; an organic EL element comprising in order from the substrate, a first display electrode, an organic functional layer, and a second display electrode; and an organic TFT for driving and controlling the organic EL element comprising in order from the substrate a gate electrode, a gate insulation film, source/drain electrodes, and an organic semiconductor layer, the organic EL display panel further comprising: a first bank having a first window section for demarcating a light emitting region on which the organic functional layer is provided on the first display electrode and a second window section demarcating a transistor region on which the organic semiconductor layer is provided between the source/drain electrodes; and a second bank located in the perimeter of the second window section and protruding in a direction that intersects with the main surface of the substrate.

The manufacturing method for an organic EL display panel described in claim 5 is a manufacturing method for an organic EL display panel having; a substrate; an organic EL element comprising in order from the substrate, a first display electrode, an organic functional layer, and a second display electrode; and an organic TFT for driving and controlling the organic EL element comprising in order from the substrate a gate electrode, a gate insulation film, source/drain electrodes, and an organic semiconductor layer, the manufacturing method comprising the steps of: forming the gate electrode and the first display electrode on the substrate; forming the gate insulation film on the gate electrode; forming the source/ drain electrodes to be mutually separated and oppose one another on the gate insulation film; forming a first bank having a first window section demarcating a region for light emission on which the organic functional layer is provided on the first display electrode, and a second window section demarcating the transistor region on which the organic semiconductor layer is provided between the source/drain electrodes; forming a second bank located in the perimeter of the second window section and protruding in a direction that intersects with the main surface of the substrate; forming the organic semiconductor layer in the second window section; forming the organic functional layer in the first window section; and forming the second display electrode using a vapor deposition method on the organic functional layer.

Figure 1:
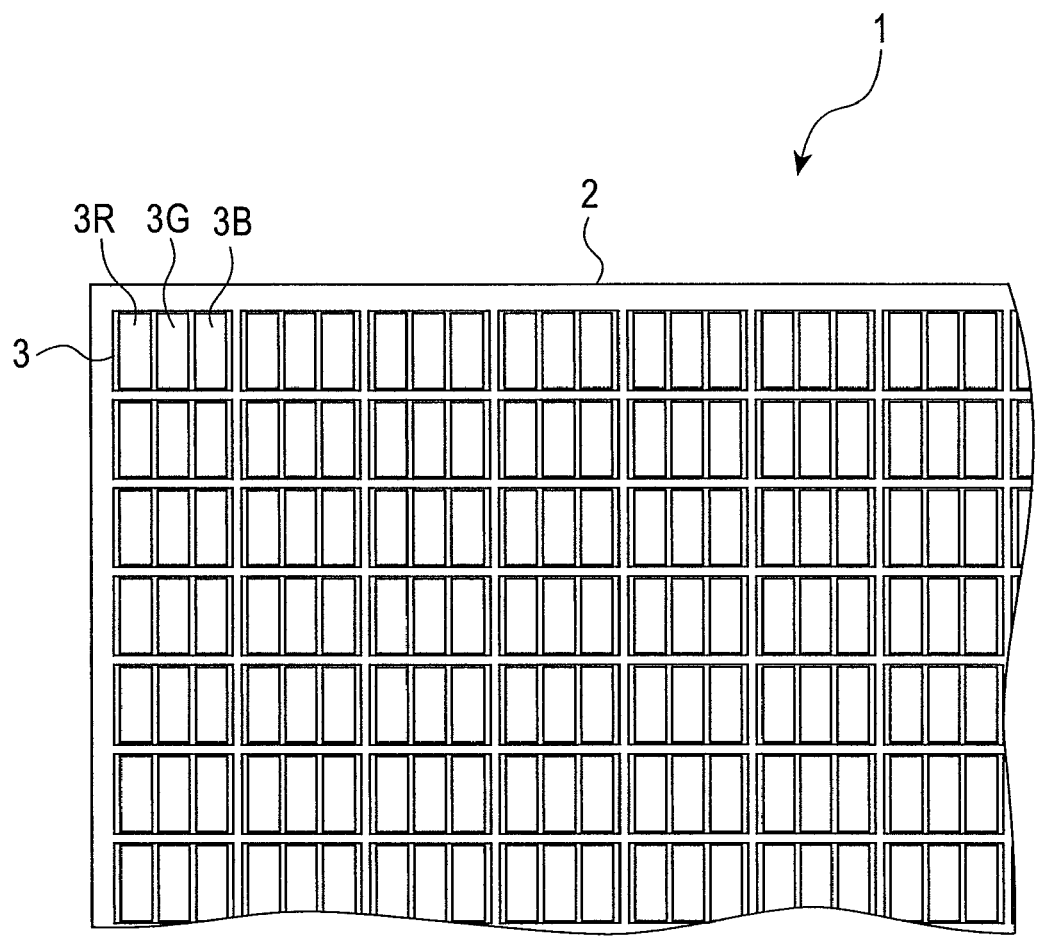
FIG. 1 is a partial expanded top view of an organic EL display panel according to the present invention.

EXPLANATION OF SIGNS 1 organic EL display panel
2 substrate
3 pixel part
3R, 3G, 3B sub-pixel
4 organic EL element
6 light emitting region
7 first window section
10 capacitor
11 first organic TFT
12 second organic TFT
13 third organic TFT
14 fourth organic TFT
15 organic TFT construction
16 transistor region
17 second window section
18 second bank
19 gate electrode
20 gate insulation film
21 source electrode
22 drain electrode
23 first bank
24 side wall surface
25 organic semiconductor layer
27 first display electrode
28 organic functional layer
35 overhanging part
36 interlayer insulation film

MODE FOR CARRYING OUT THE INVENTION

An embodiment of the organic EL display panel according to the present invention will be described below in detail while referring to the attached drawings.

As shown in FIG. 1, an active-matrix drive organic EL display panel 1 with a plurality of organic TFT comprises a substrate 2 and a plurality of pixel units 3 arranged in a matrix on the main surface of the substrate 2. The pixel units 3 are comprised of three sub-pixels (3R, 3G, 3B) each emitting one of the three primary colors red (R), green (G), and blue (B), and the sub-pixels (3R, 3G, 3B) are placed side-by-side in the pixel unit 3.

Figure 2:
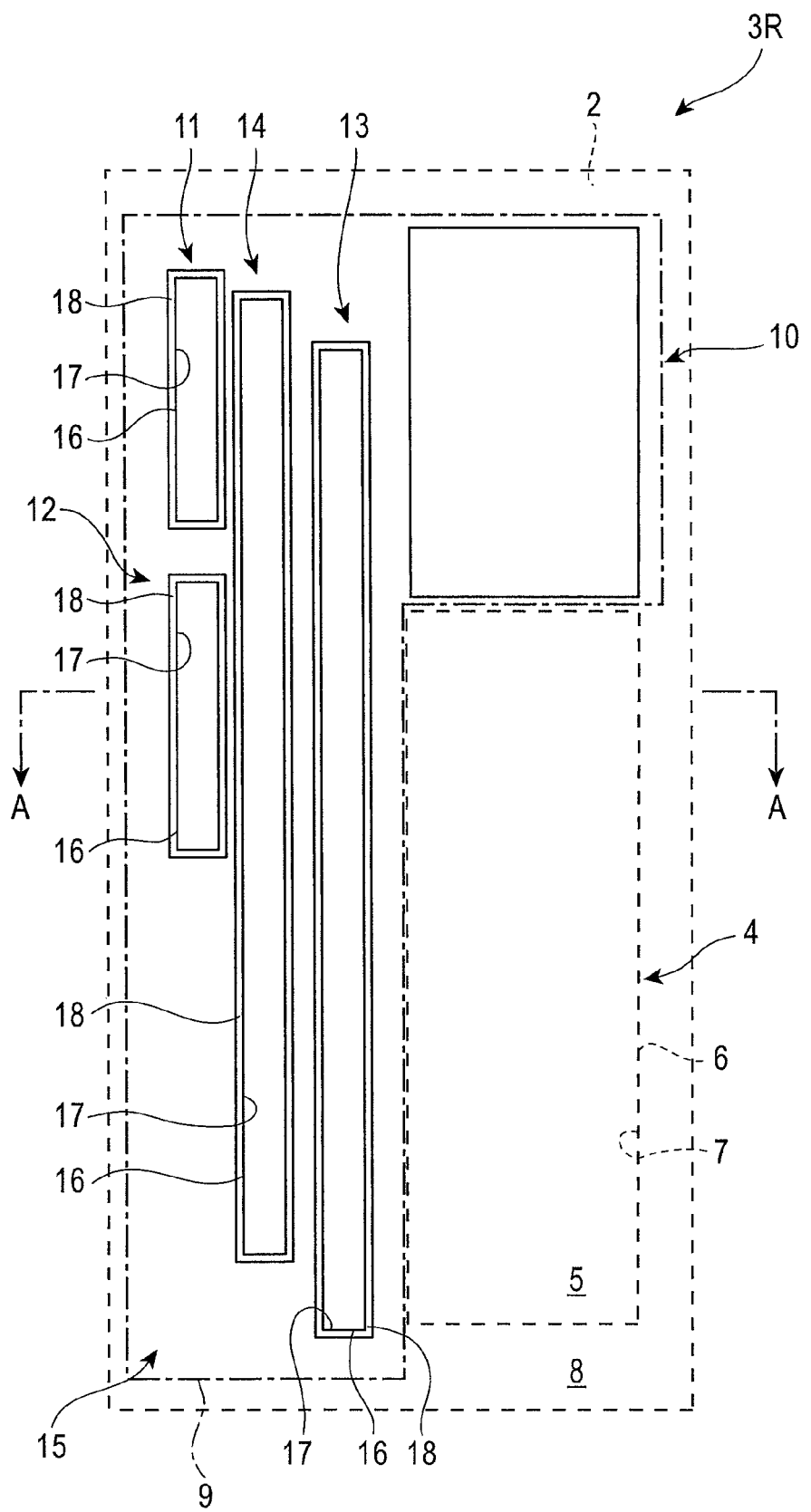
FIG. 2 is an expanded top view of a sub-pixel of an organic EL display panel according to the present invention.

The sub pixels (3R, 3G, 3B) are each comprising organic EL elements (not shown in FIG. 1). Note, an example of a sub-pixel will be described based on a sub-pixel 3R comprising an organic EL elements 4 that emits red (R) light, as shown in FIG. 2. Furthermore, in order to simplify the description, the wiring that connects the component elements that compose the sub-pixel 3R has been omitted from FIG. 2.

The organic EL element 4 has a first display electrode (not shown in FIG. 2) and a second display electrode 5 acting as an anode and a cathode, as well as an organic functional layer (not shown in FIG. 2) positioned between the first and second display electrodes, arranged in the order of the first display electrode, the organic functional layer, and the second display electrode 5, beginning from the substrate 2. The organic functional layer comprises a light emitting layer (not shown in the drawing) that can emit light by rejoining electron holes and electrons. Furthermore, the organic functional layer can optionally have an electron holes injection layer, electron holes transport layer, electron transport layer and/or electron injection layer, in order to increase the injectability and transportability of the electron holes and electrons toward the light emitting layer.

With an organic EL element 4 having the aforementioned construction, the region above the first display electrode which contains the organic functional layer is the light emitting region 6, and the light emitting region 6 is demarcated by a first window section 7 of a first bank (not shown in FIG. 2). Herein, the light emitting region 6 refers to the region where light is emitted by the light emitting layer of the organic functional layer positioned between the first and second display electrodes, and light is discharged from this light emitting region 6. The first bank is made from a water repellent insulation material which is made from a fluorine based photosensitive resin. The shape of the first window section 7 corresponds to the shape of the light emitting region 6. Note, an electrode connecting layer 8 made from a conductive material which connects to the second display electrode 5 is located above the first bank.

A drive unit 9 for driving the organic EL element 4 is provided in proximity to the organic EL element 4, and the drive unit 9 comprises a capacitor 10. The capacitor 10 comprises a first capacitor electrode and a second capacitor electrode (neither shown in FIG. 2) and a capacitor insulation film (not shown in FIG. 2) positioned between the first and second capacitor electrodes. The first bank is also positioned above the second capacitor electrode.

Furthermore, in the sub-pixel 3R, organic TFTs (11 through 14) are provided in proximity to the organic EL element 4 and the capacitor 10. In FIG. 2, the sub-pixel has four organic TFTs (11 through 14), and this plurality of organic TFTs (11 through 14) compose an organic TFT construction 15. Furthermore, the four organic TFTs (11 through 14) together with the capacitor 10 form the drive unit 9 of the organic EL element 4. Note, the four organic TFTs (11 through 14) function as either switching transistors or driving transistors, and the details will be described below.

Each of the organic TFTs (11 through 14) comprises a gate electrode (not shown in FIG. 2) on the substrate 2, a gate insulation film (not shown in FIG. 2) formed on the gate electrode, source/drain electrodes (not shown in FIG. 2), mutually separated and counterfacing, provided on the gate insulation film, and an organic semiconductor layer (not shown in FIG. 2) facing towards the gate electrode through the gate insulation film and provided between the source/drain electrodes. The organic semiconductor layer comprises a transistor region 16 and a channel is formed between the source and drain electrodes of the transistor region 16. The transistor region 16 is demarcated by the second window section 17 of the first bank. The second window section 17 is formed in each of the organic TFTs, and the shape of the second window section 17 corresponds to the shape of the channel of each of the organic TFTs. A second bank 18 protruding in a direction intersecting with the main surface of the substrate is formed in the perimeter of the second window section 17.

Figure 3:
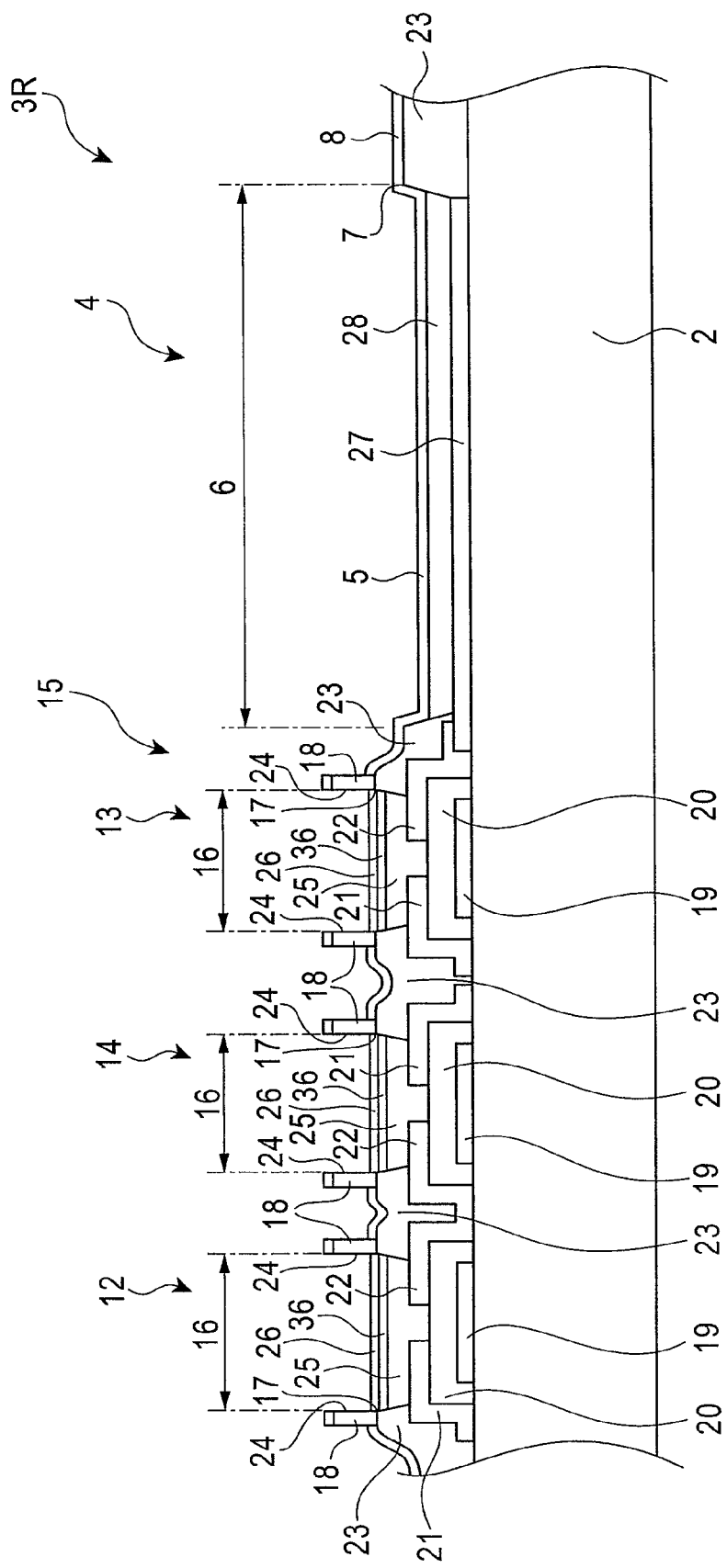
FIG. 3 is a cross-section view along line A-A in FIG. 2.

As shown in FIG. 3, a gate electrode 19 is formed on the substrate 2. The substrate 2 is made of glass, and the gate electrode 19 is a conductive thin film made from tantalum (Ta). Note, the substrate 2 is not restricted to glass substrates, and resin substrates, or glass and plastic composite substrates are also acceptable. Furthermore, in the specification of the present invention, the substrate refers to a member that supports the organic EL element and the organic TFT, and includes constructions where an alkali barrier film and/or a gas barrier film or the like is formed on the surface of the material such as glass and/or resin. The gate electrode 19 is connected to a charge control line and a scanning line (not shown in FIG. 3). A gate insulation film 20 is formed on the gate electrode 19. The gate insulation film 20 is made from tantalum oxide ($Ta_2O_5$), and can be formed by anodic oxidation of the tantalum of the gate electrode 19.

A source electrode 21 and a drain electrode 22 are formed on the gate insulation film 20, and the source electrode 21 and the drain electrode 22 are separated and mutually counterfacing on the gate insulation film 20. The source electrode 21 and the drain electrode 22 are thin metal films (Cr/Au) made of gold (Au) with chromium (Cr) as an adhesive layer. Note, the source electrode 21 and the drain electrode 22 are connected to a data line and a power line (neither shown in FIG. 3).

The region above the electrode pair consisting of the source electrode 21 and the drain electrode 22 which are mutually separated and counterfacing on the gate insulation film 20, together with the region therebetween is the transistor region 16, and the transistor region 16 is demarcated by the second window section 17 of the first bank 23.

A second bank 18 protruding in the direction that intersects with the main surface of the substrate 2 is positioned on the perimeter of the second window section 17. As shown in FIG. 3, the second bank 18 has a side wall surface 24 which is essentially parallel to the perpendicular plane of the main surface of the substrate 2, and the cross-sectional shape is essentially rectangular. The second bank 18 is made from an insulative fluorine based photosensitive resin.

Of the region above the source electrode 21 and the drain electrode 22, an organic semiconductor layer 25 is provided in the transistor region 16 which is demarcated by the second window section 17. The organic semiconductor layer 25 is also positioned in the interval between the source electrode 21 and the drain electrode 22 on the gate insulation film 20. In this interval region, the organic semiconductor layer 25 contacts the gate insulation film 20 and is facing towards the gate electrode 19 via the gate insulation film 20. In this interval region, the organic semiconductor layer 25 may act as the channel for the organic TFT (11 through 14). The organic semiconductor layer 25 is made from an organic material with semiconductor properties, and for instance may be made from poly-3-hexylthiophene (P3HT). Note, the organic semiconductor layer 25 may comprise a plurality of materials with semiconductor properties, or may be a multilayered structure. Furthermore, an interlayer insulation film 36 is provided on the organic semiconductor layer 25.

Note, an electrode deposition film 26 made from a conductive material is provided on the top region of the second bank 18 and the interlayer insulation film 36. This vapor deposition film 26 is formed when forming the second display electrode 5 of the organic EL element 4 which will be discussed later, and the range for forming the film is demarcated by the second window section 17 and the second bank 18.

The organic EL element 4 located in proximity to the group of organic TFTs comprises, in order from the substrate 2, a first display electrode 27, an organic functional layer 28, and a second display electrode 5. The first display electrode 27 is connected to the drain electrode 22 of the organic TFT 13 which is located in proximity to the organic EL element. The organic functional layer 28 is provided in the light emitting region 6 of the first display electrode 27, and the light emitting region 6 is demarcated by the first window section 7 of the first bank 23.

The second display electrode 5 is connected to the organic functional layer 28 which is provided in the first window section 7. Furthermore, the second display electrode 5 is connected to the electrode connecting layer 8 which extends over the first bank 23. The second display electrode 5 and the electrode connecting layer 8 are made from a metal material such as aluminum (Al), and can be formed by a vapor deposition method. Note, the size of the first window section 7 is enlarged in the direction moving away from the main surface of the substrate, and the frame of the first window section includes an inclined surface. The inclined surface of this frame has a cross-section angle that is essentially 30 degrees with regards to the substrate 2. If the second display electrode 5 and the electrode connecting layer 8 are formed by a vapor deposition method, the frame of the first window section can be integrally formed without a seam between the second display electrode 5 and the electrode connecting layer 8 by having an inclined surface in the frame of the first window section.

Note, although not shown in the drawings, the pixel unit of the organic EL display device with the construction as described above is sealed by a sealing film or a dish shaped sealing cap, and therefore the organic EL element will not come in contact with oxygen or moisture in the atmosphere.

Figure 4:
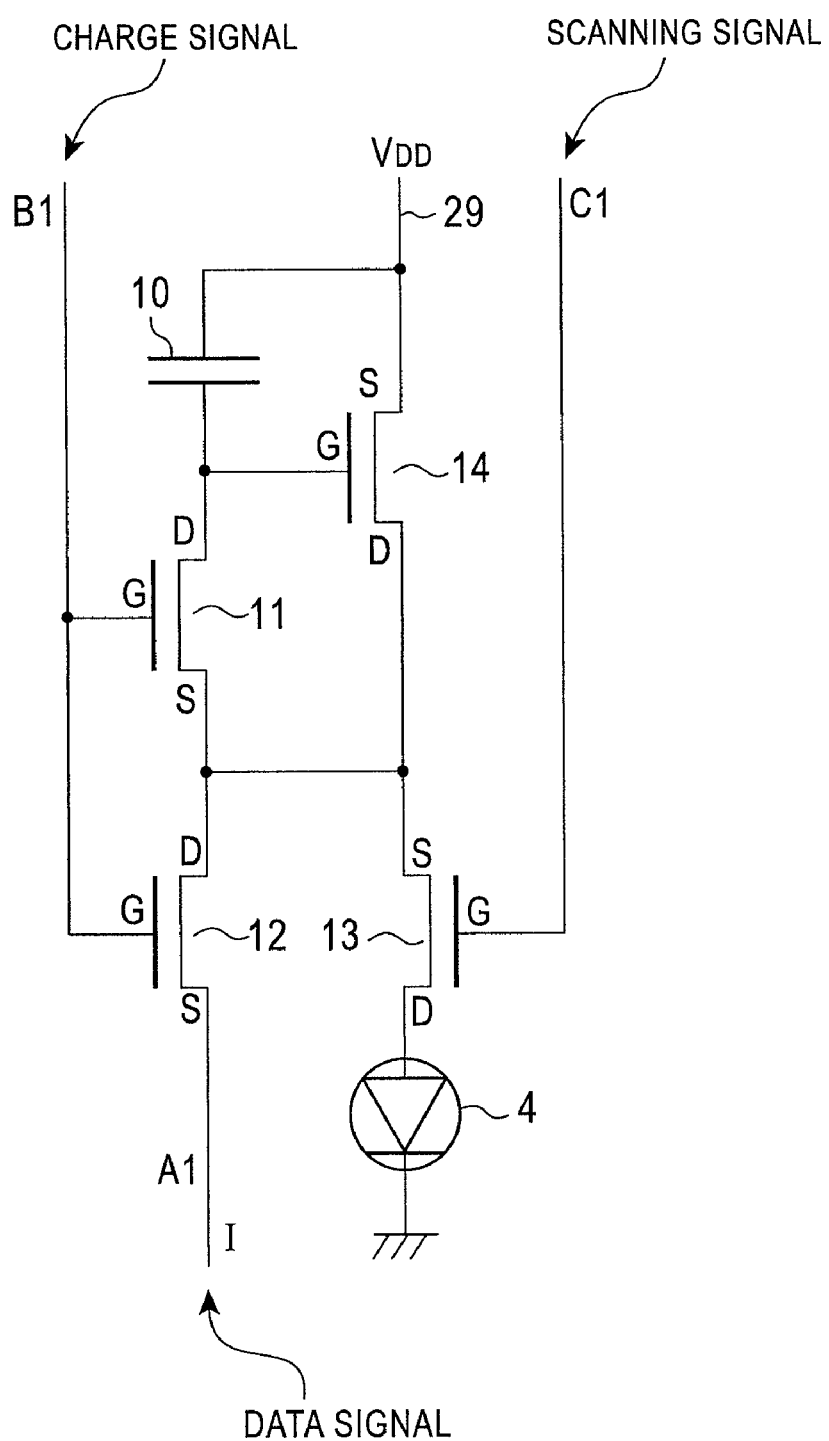
FIG. 4 is a circuit diagram showing construction of a sub-pixel for an active matrix drive organic EL display panel.

The structure of a sub-pixel with the aforementioned construction can be shown using a circuit diagram as shown in FIG. 4. The organic EL element 4, the first through fourth organic TFTs (11 through 14), and the capacitor 10 are provided in the sub-pixel. The capacitor 10 maintains an electric charge corresponding to a data signal provided through the data line A1, and adjusts the gradations of the light emission of the organic EL element 4. In other words, the capacitor 10 maintains a voltage corresponding to the current that flows through the data line A1. The organic EL element 4 is a current driven light emitting element similar to a photo diode, and is therefore drawn using the symbol for a diode.

A source S of the first organic TFT 11 is connected to the drain D of both the second and fourth organic TFT (12, 14) as well as to the source S of the third organic TFT 13. The drain D of the first organic TFT 11 is connected to a gate G of the fourth organic TFT 14. The capacitor 10 is connected between the source S of the fourth organic TFT 14 and the gate G. Furthermore, the source S of the fourth organic TFT 14 is connected to a power line 29 and a drive voltage $V_{DD}$ is supplied to the power line 29. For the organic EL element 4, the first display electrode 27 (refer to FIG. 3) which is the anode is connected to the drain D of the third organic TFT 13, and the second display electrode 5 is connected to the cathode.

The gate G of the first organic TFT 11 in the second organic TFT 12 is connected to the charge control line B1 that controls the charging of the capacitor 10, and a charge signal is input for writing data. Furthermore, the gate G of the third organic TFT 13 is connected to the scanning line C1, and a scanning signal is input for setting the light emitting period.

The first organic TFT 11 and the second organic TFT 12 are switching transistors which are used when accumulating a charge in the capacitor 10. The third organic TFT 13 is a switching transistor that is maintained in the ON condition during the organic EL element 4 light emitting period. Furthermore, the fourth organic TFT 14 is a drive transistor for controlling the current that flows to the organic EL element 4. The current of the fourth organic TFT 14 is controlled by the charge maintained by the capacitor.

Figure 5:
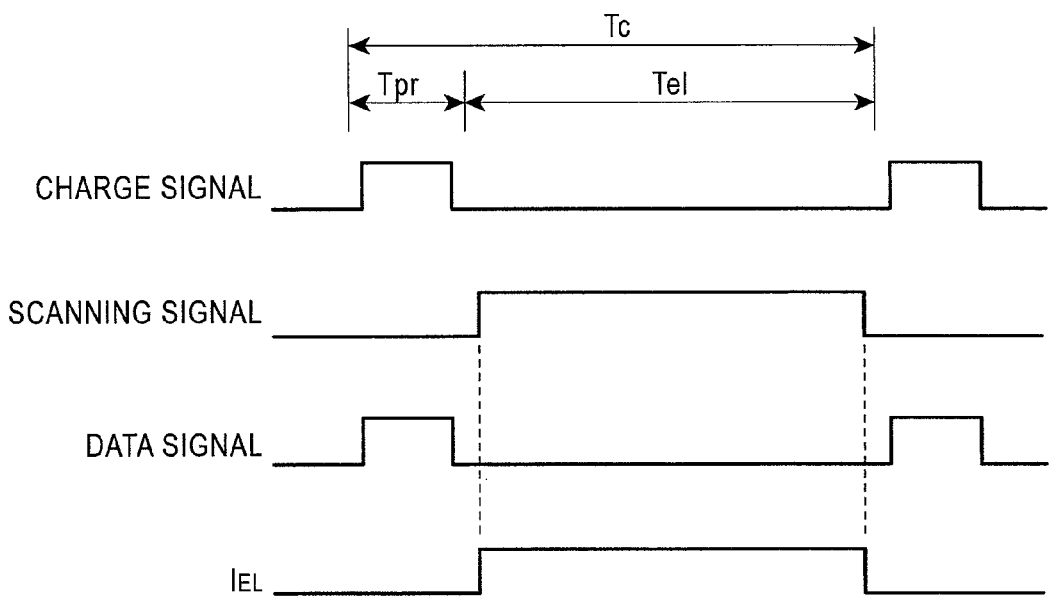
FIG. 5 is a timing chart showing the function of a sub-pixel of the organic EL display panel according to the present invention.

FIG. 5 is the timing chart showing the operation of the sub-pixel, and shows the charge signal input through the charge control line B1, the scanning signal input through the scanning line C1, the data signal (data current I) input through the data line A1, and the current $I_{EL}$ that flows to the organic EL element.

Furthermore, Tc is the time of a single frame and is the time period to rotate through all the scanning lines and complete selection. Tpr is the program timing, and is the timing for setting the light emitting gradations of the organic EL element in the sub-pixel, and is determined by the charge signal used for writing the data which is input through the charge control line B1. Tel is the light emitting timing, and is the time that the organic EL element emits light, and is determined by the scanning signal for setting the light emitting period which is input through the scanning line C1.

During the program timing Tpr, an H level charge signal is output to the charge control line B1 from the charge control line drive circuit (not shown in the drawings) while at the same time, a data signal based on the light emission gradation is output to the data line A1 from the data line drive circuit (not shown in the drawings). Therefore, the first and second organic TFT (11, 12) will be in the ON condition. At this time, the data line drive circuit (not shown in the drawing) functions as a variable constant current source that provides a data current value I based on the light emission gradation. Furthermore, the capacitor 10 maintains a charge corresponding to the data current value I, and the program timing Tpr is finished. As a result, the voltage recorded by the capacitor 10 is applied between the source/gate of the fourth organic TFT 14.

When the program timing Tpr is complete, the charge signal will be at the L level and the first organic TFT 11 and the second organic TFT 12 will be in the OFF condition. Furthermore, the data drive circuit (not shown in the drawings) will stop supplying the data signal (current value I) for the pixel circuit.

Continuing, during the light emission timing Tel, the charge signal is maintained at the L level and the first and second organic TFT 11, 12 are maintained in the OFF condition, while a H level scanning signal is output to the scanning line C1 from the scan line drive circuit (not shown in figure) and the third organic TFT 13 is set to the ON condition.

The capacitor 10 already maintains a charge corresponding to the data signal (data current value I). Furthermore, a current essentially identical to the data current value I is made to flow to the fourth organic TFT 14, then the current flows to the organic EL element 4 via the third organic TFT 13. As a result, the organic EL element 4 will emit light at a gradation based on the data signal (data current value I) during the light emitting period Tel.

Next, the manufacturing method will be shown for an organic EL display device that has an organic TFT construction as shown above. Note, the case where the size of the sub-pixel was 180 μm×60 μm, the aperture ratio of the organic EL element was 30%, and the number of organic TFT was 4 will be described, but there is no restriction to this size.

Figure 6:
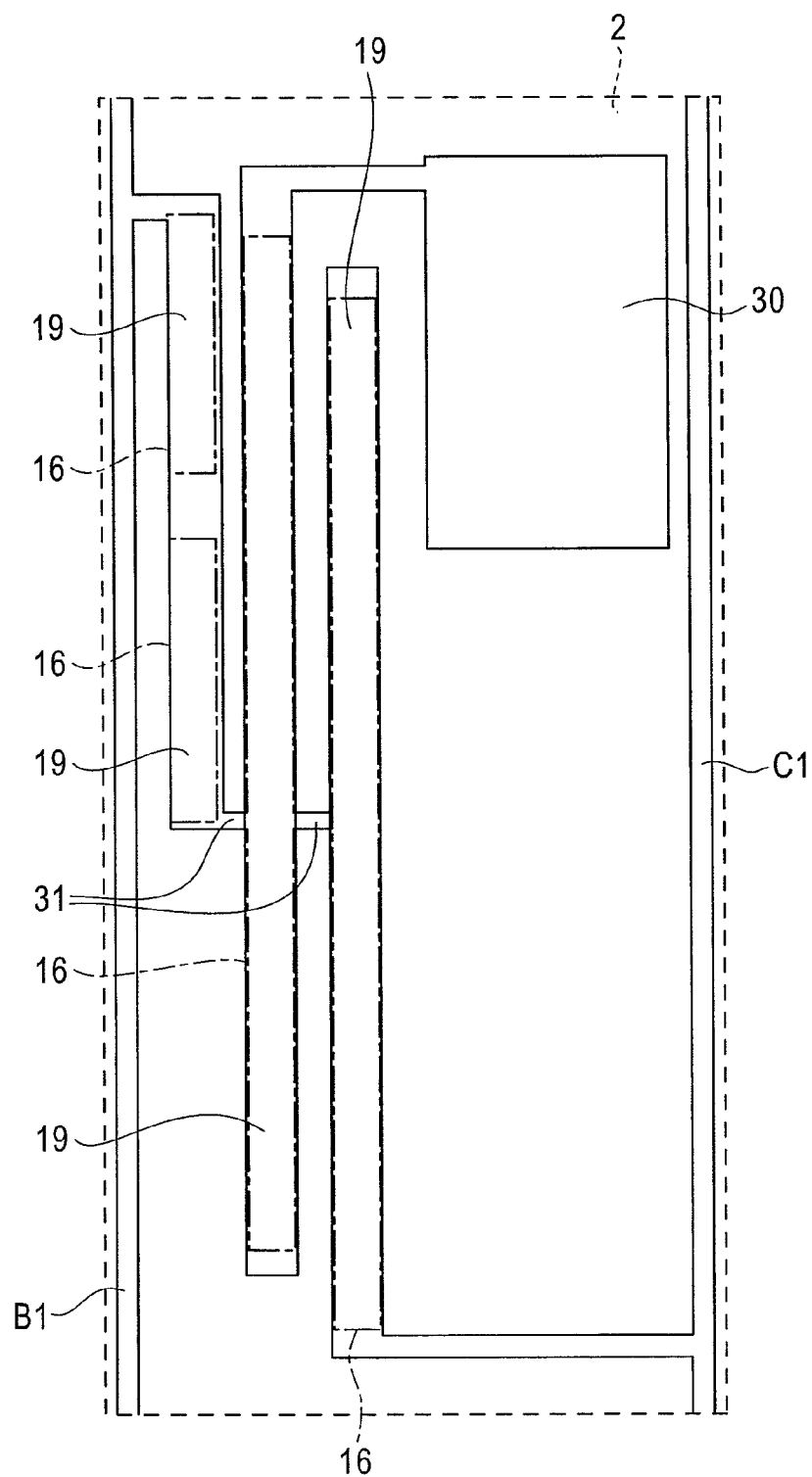
FIG. 6 is a top view for describing the manufacturing process of a sub-pixel for the organic EL display panel of the present invention.

First, a thin tantalum (Ta) film was formed on a glass substrate made from a non-alkali glass, and then a pattern was formed in the Ta thin-film as shown in FIG. 6 using reactive ion etching (RIE). The thin Ta film pattern includes a gate electrode 19, charge control line B1 scanning line C1 and a first capacitor electrode 30. Furthermore, the Ta thin film pattern also comprises a bridge section 31 for electrically connecting the gate electrodes 19 together. Note, the gate electrode 19 is provided on the transistor region (shown by the dotted line in FIG. 6. Similarly shown in FIG. 7 through FIG. 10.

Figure 7:
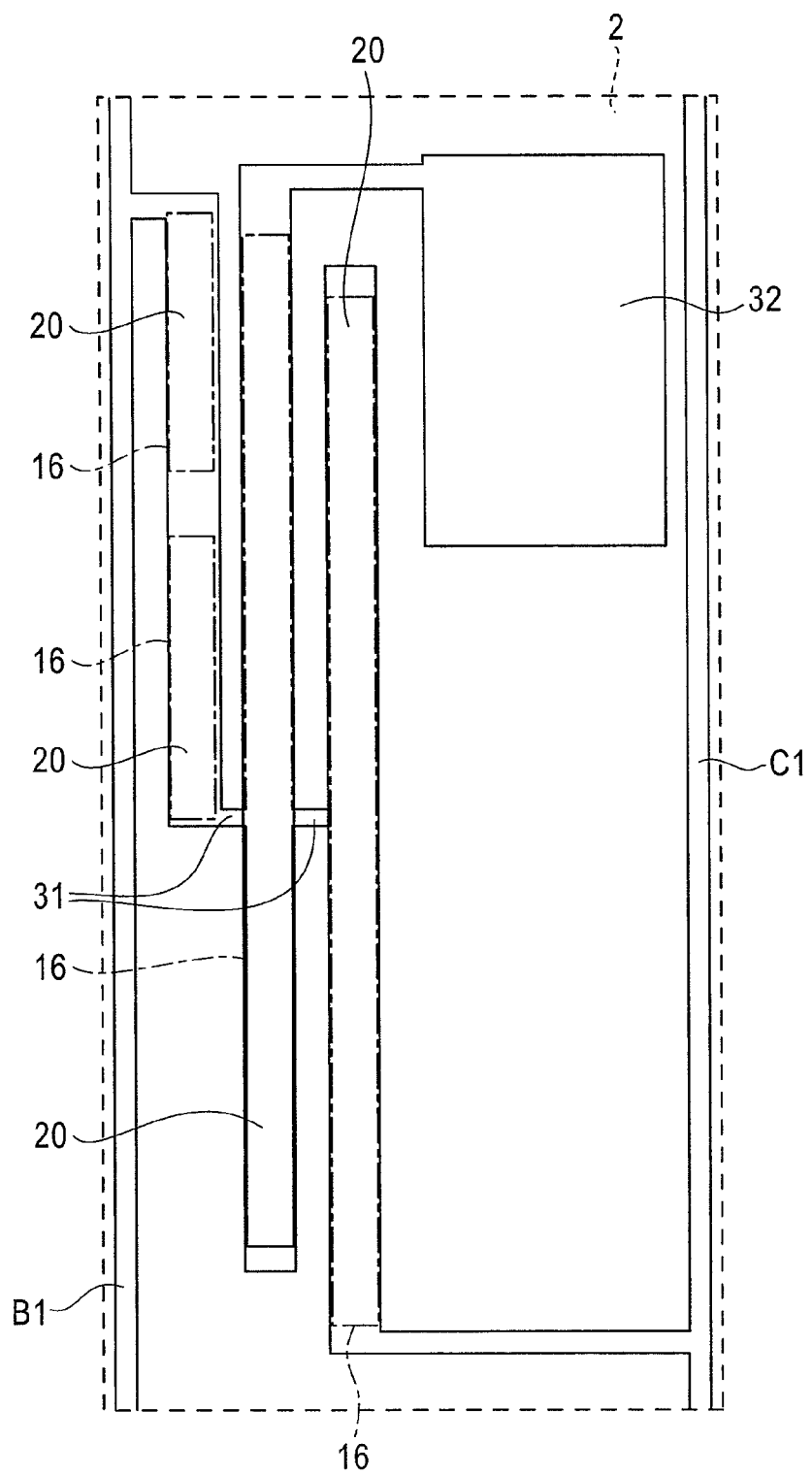
FIG. 7 is a top view for describing the manufacturing process of a sub-pixel for the organic EL display panel of the present invention.

Anodic oxidation was performed on the thin Ta film pattern, and a tantalum oxide ($Ta_2O_5$) was formed on the surface of the thin Ta film. As shown in FIG. 7, the $Ta_2O_5$ film is the gate insulation film 20 on the gate electrode 19, and becomes the capacitor voltage film 32 on the first capacitor electrode 30. Note, the bridge section 31 is included in the thin Ta film so anodic oxidation of the thin Ta film can be performed in a single step. In this case, the Ta film thickness was 100 nm, and the $Ta_2O_5$ film thickness was 150 nm.

Figure 8:
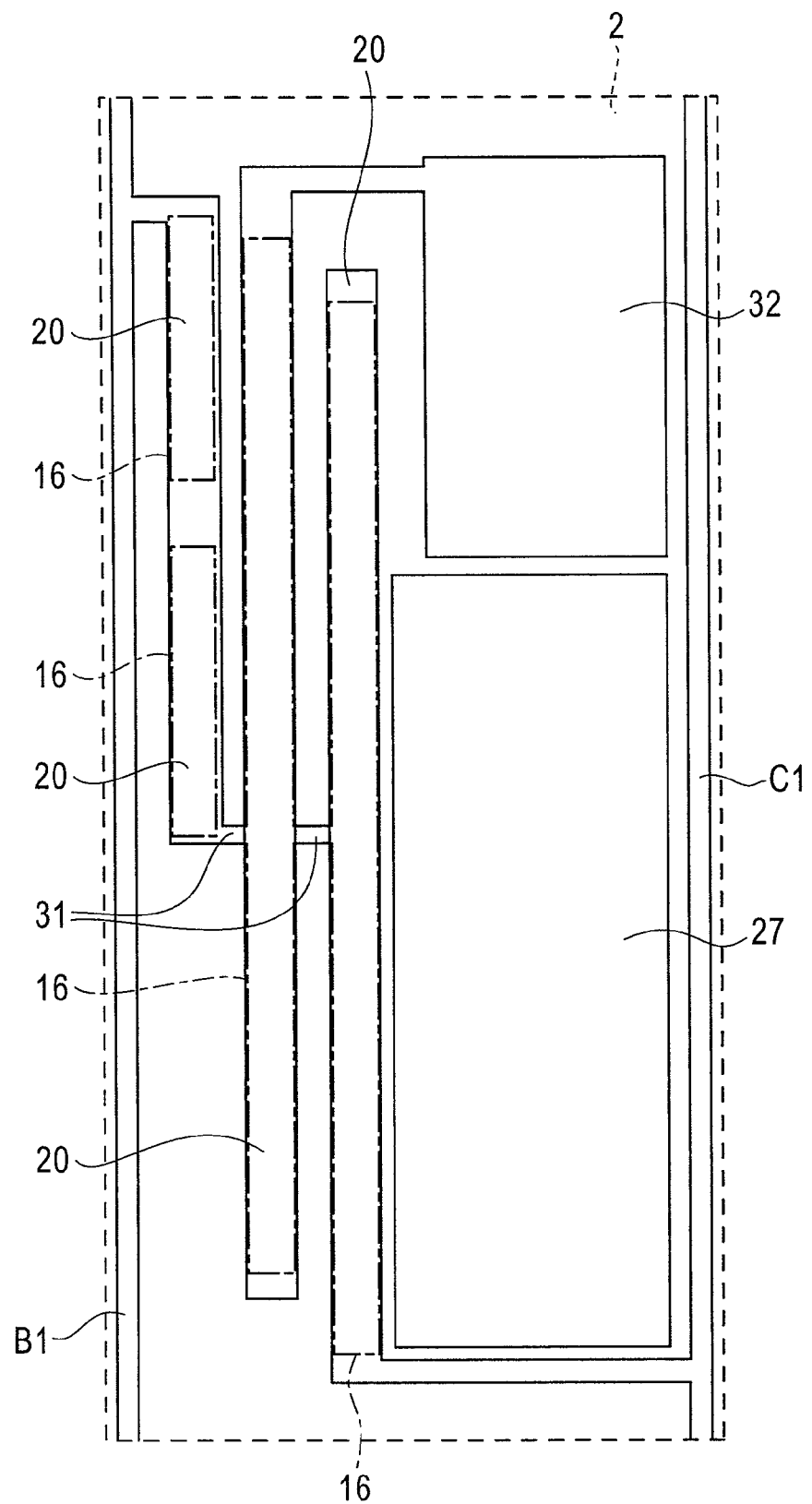
FIG. 8 is a top view for describing the manufacturing process of a sub-pixel for the organic EL display panel of the present invention.

Next, as shown in FIG. 8, an indium zinc oxide (IZO) film was formed on the substrate, and then an IZO pattern was formed in the thin-film using a lift-off method to make the first display electrode 27 of the organic EL element. Note, the size of the first display electrode 27 was 30 μm×110 μm, and the film thickness was 110 nm.

Figure 9:
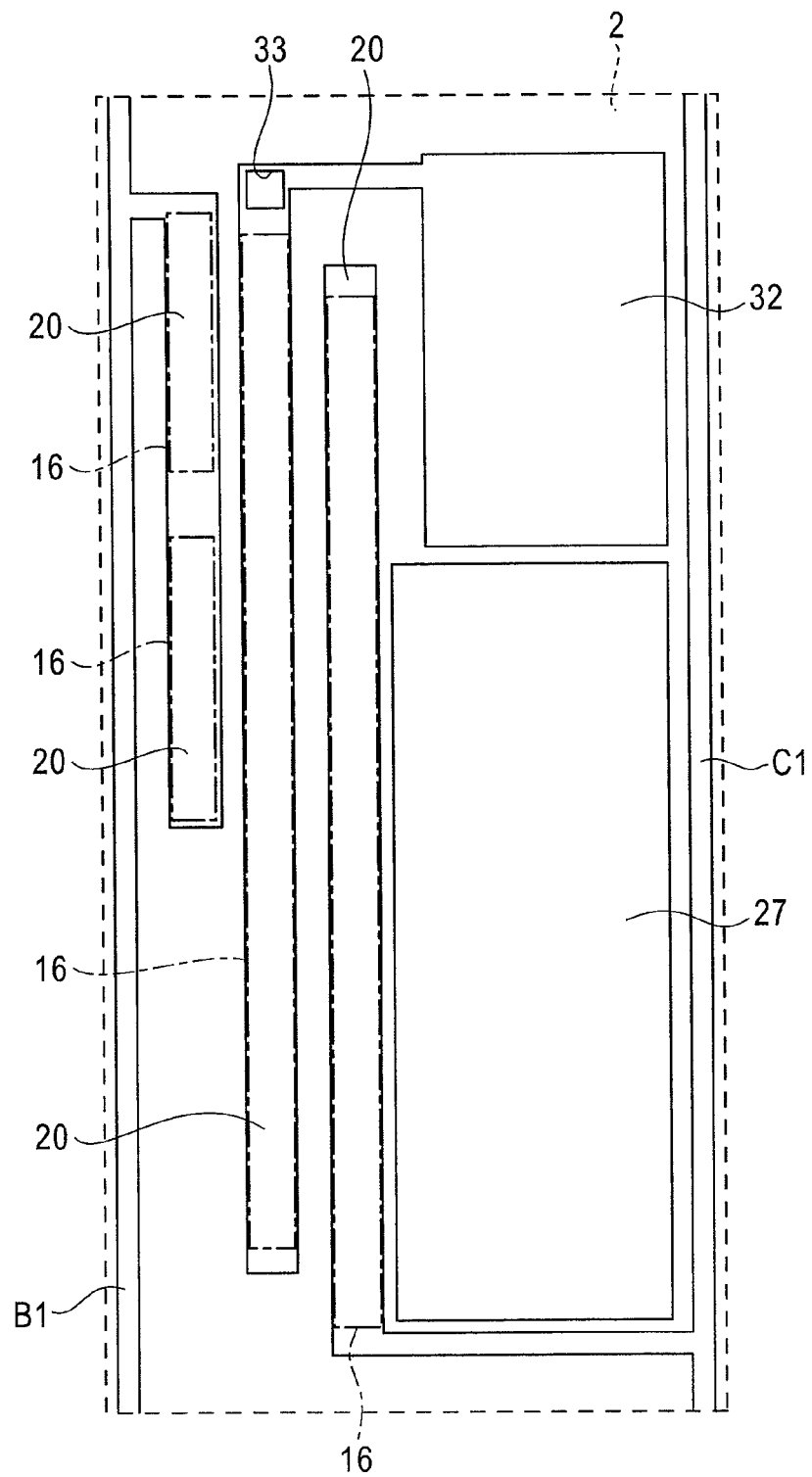
FIG. 9 is a top view for describing the manufacturing process of a sub-pixel for the organic EL display panel of the present invention.

The Ta thin film bridge section 31 was removed using reactive ion etching, and the gate electrodes that had been connected by the bridge section 31 were electrically disconnected. Furthermore, as shown in FIG. 9, a through hole 33 was formed in the Ta$_2$O$_5$ thin film between the first capacitor electrode 30 and the gate electrode 19.

Figure 10:
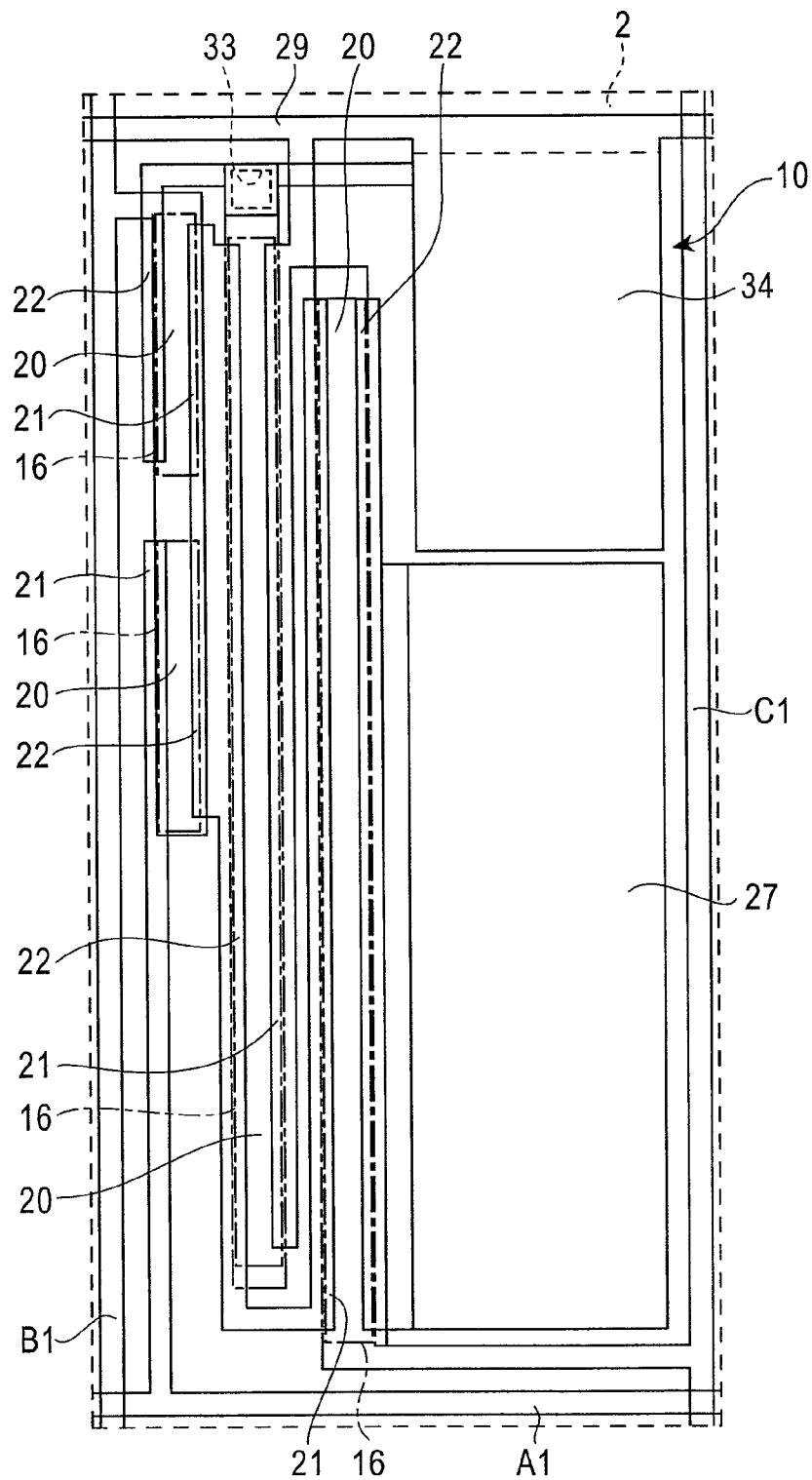
FIG. 10 is a top view for describing the manufacturing process of a sub-pixel for the organic EL display panel of the present invention.

Next, gold (Au) was formed by a magnetron sputtering method using chromium (Cr) as an adhesive layer, and a pattern as shown in FIG. 10, or in other words a Cr/Au metal film forming a pair of electrodes mutually separated and counterfacing on the gate insulative film, was formed using a lift-off method. This Cr/Au metal film forms the source electrode 21 and the drain electrode 22 on the gate insulation film 20 and the second capacitor electrode 34 on the capacitor insulation film 32, as well as the data line A1 and the power line 29. Note, the drain electrode 22 of the third organic TFT 13 provided in proximity to the first display electrode 27 is connected to the first display electrode 27. Note, the film thickness of the Cr film was 5 nm, and the thickness of the Au film was 100 nm.

Furthermore, the source electrode 21 and the drain electrode 22 were formed such that the length of the organic TFT channel eventually formed would be 2 μm. Furthermore, of the four organic TFT, the channel width was 40 μm for 2 of the organic TFT and the channel width was 150 μm for the other two.

Figure 11:
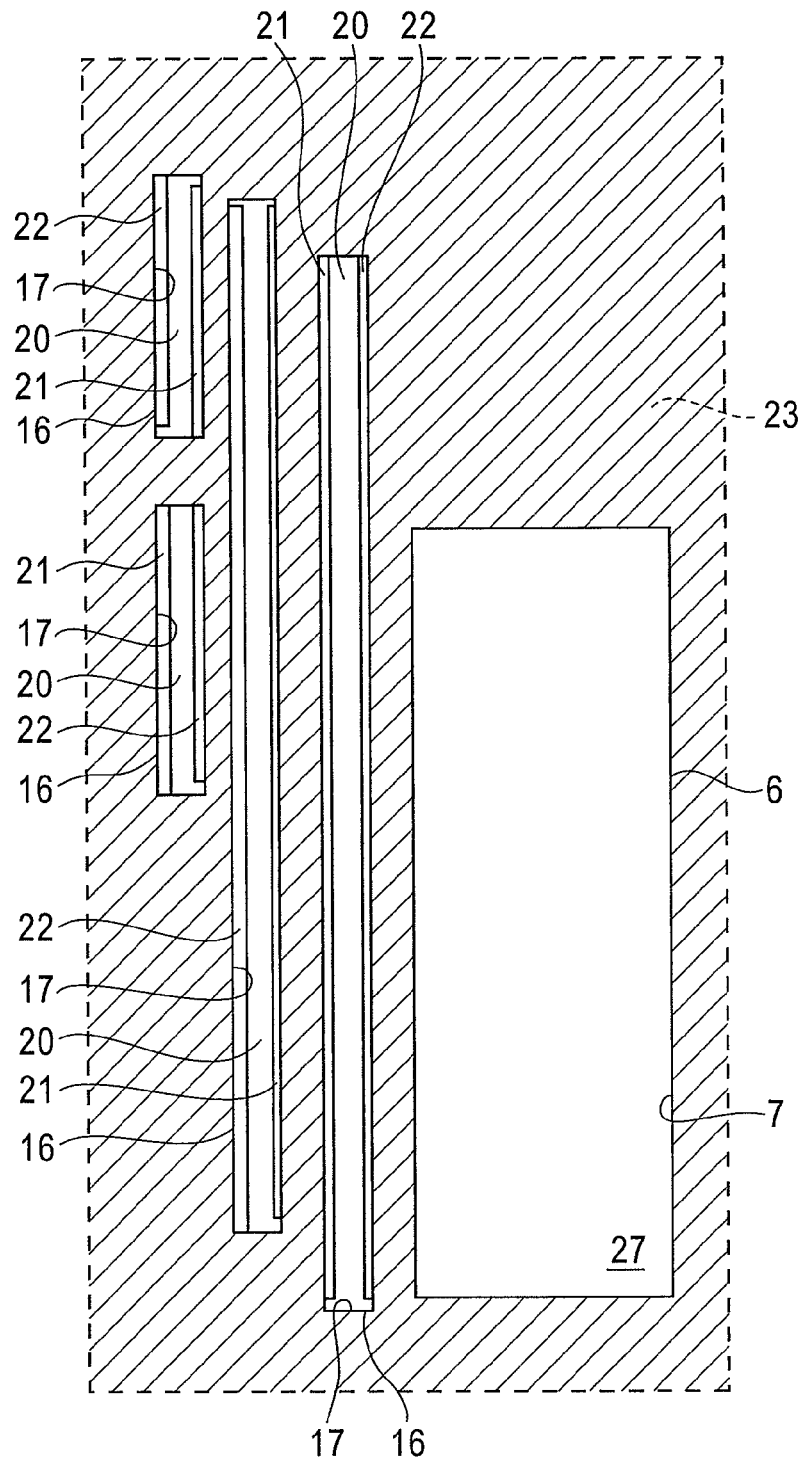
FIG. 11 is a top view for describing the manufacturing process of a sub-pixel for the organic EL display panel of the present invention.

As shown in FIG. 11, the first bank 23 is formed comprising a first window section 7 that demarcates a light emitting region 6 on the first display electrode 27 and a second window section 17 that demarcates the transistor region 16 between the source/drain electrodes (21, 22). The first bank 23 is formed by applying unexposed fluorine based photosensitive resin solution using a spin coat method and then exposing and developing using a photomask. In the first bank 23, the first window section 7 is formed to a size such that the light emitting region is 30 μm×110 μm, and the second window section 17 is formed to a size such that the transistor region can be either 10 μm×50 μm or 10 μm×160. Furthermore, the height of the first bank 23 is 3 μm.

Figure 12:
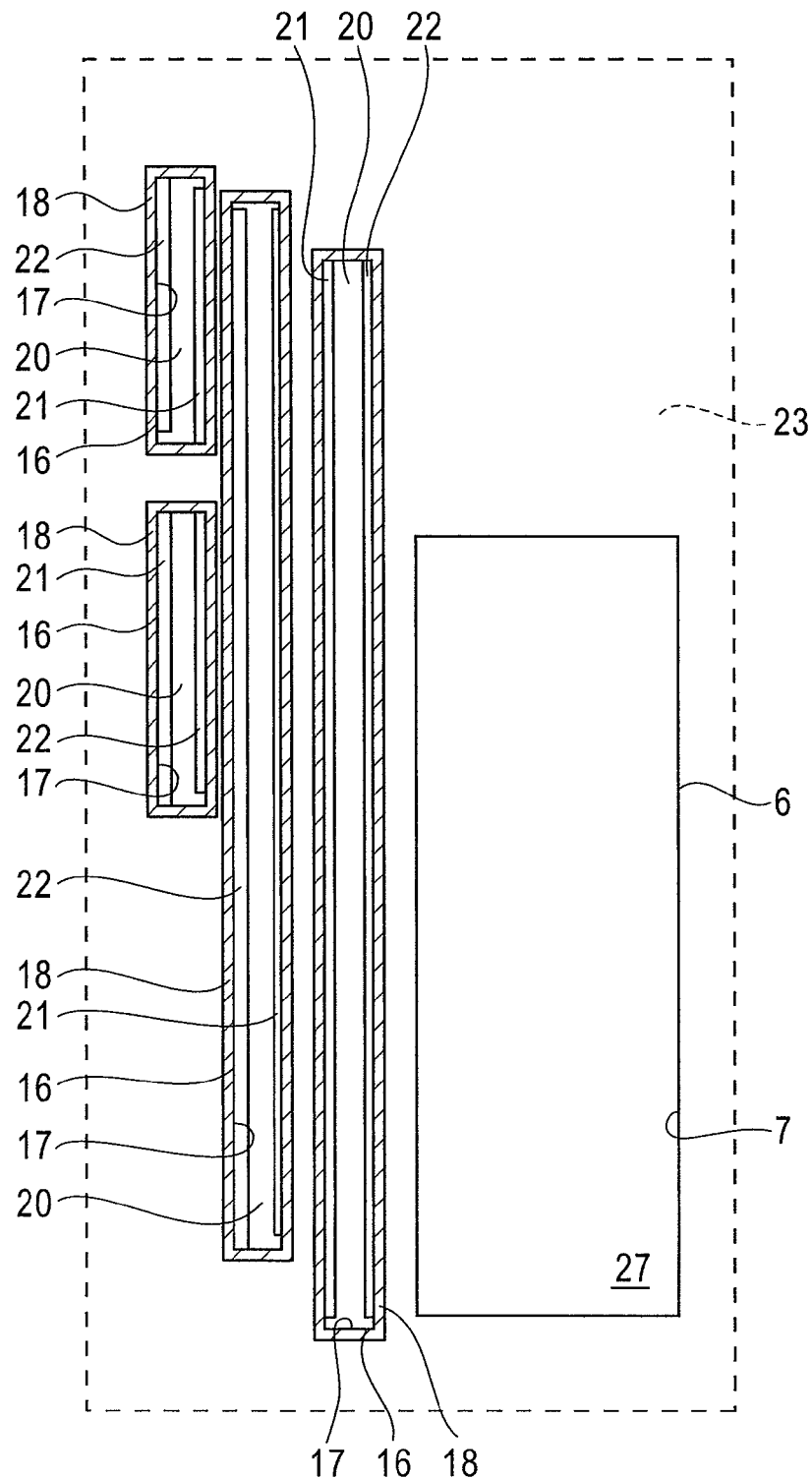
FIG. 12 is a top view for describing the manufacturing process of a sub-pixel for the organic EL display panel of the present invention.

As shown in FIG. 12, after forming the first bank 23, the second bank 18 is formed to protrude in a direction that intersects with the main surface of the substrate 2 around the perimeter of the second window section 17. The second bank 18 is formed using a fluorine based photosensitive resin, and a pattern is formed using a photomask.

Figure 13:
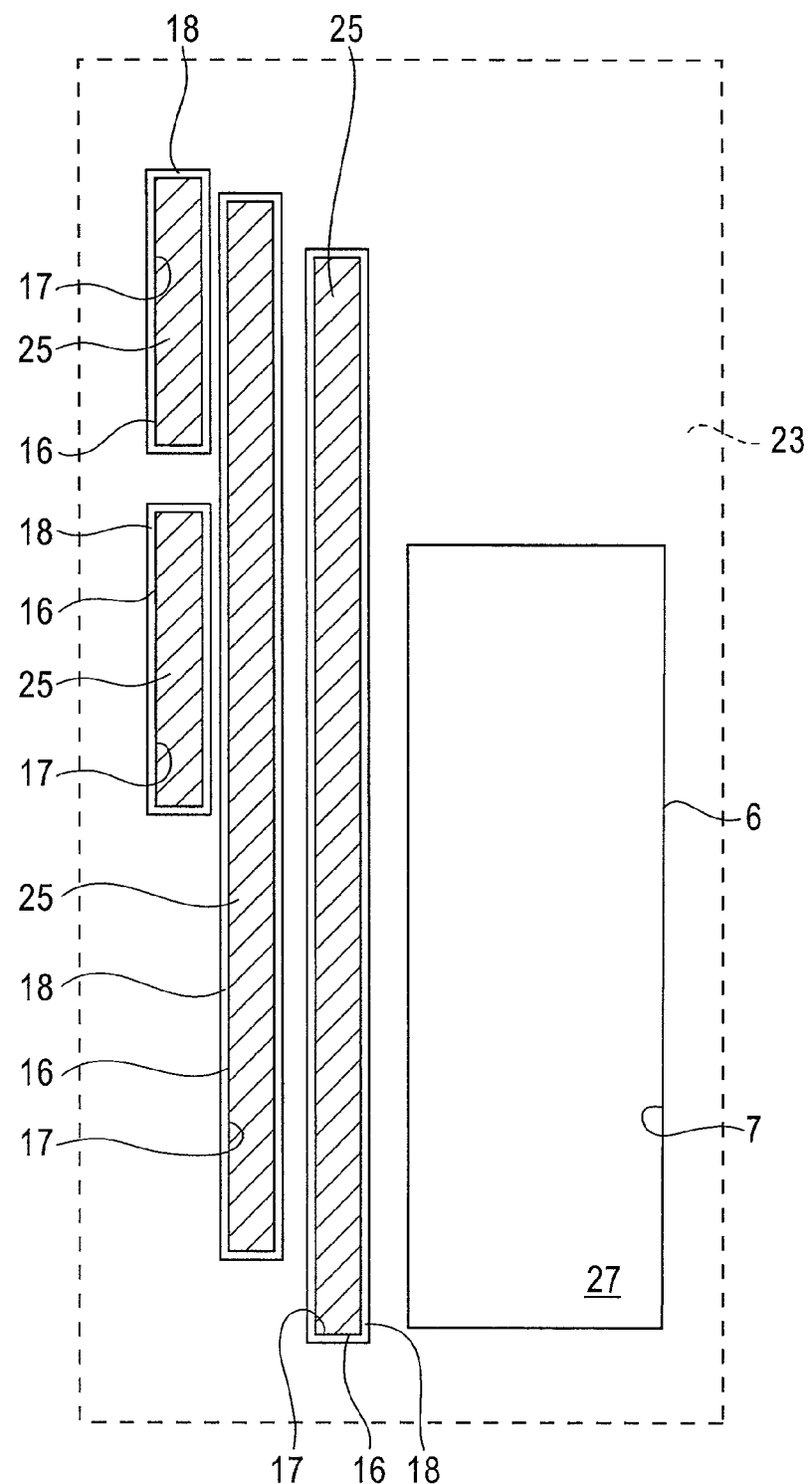
FIG. 13 is a top view for describing the manufacturing process of a sub-pixel for the organic EL display panel of the present invention.

As shown in FIG. 13, after the second bank 18 is formed, the organic semiconductor layer 25 is formed using an inkjet method in the transistor region 16 encompassed by the second window section 17 of the first bank 23. Specifically, droplets are sprayed from the ink discharge nozzle toward the inside of the second window section 17 to form the organic semiconductor layer 25. The organic semiconductor layer 25 is made of P3HT which is an organic material that has semiconductor properties. Using the inkjet method, droplets that are sprayed from the inkjet nozzle (not shown in the drawings) are repelled by the first bank 23 and positioned in the second window section 17, and the organic semiconductor layer 25 is formed by these droplets in the transistor region 16 encompassed by the second window section 17. This organic semiconductor layer 25 forms the channel for the organic TFT. Next the interlayer insulation film 36 is formed using an inkjet method. Note, the droplets which are sprayed from the inkjet nozzle are prevented from leaking out and spreading from the transistor region 16 by forming the second bank 18.

Figure 14:
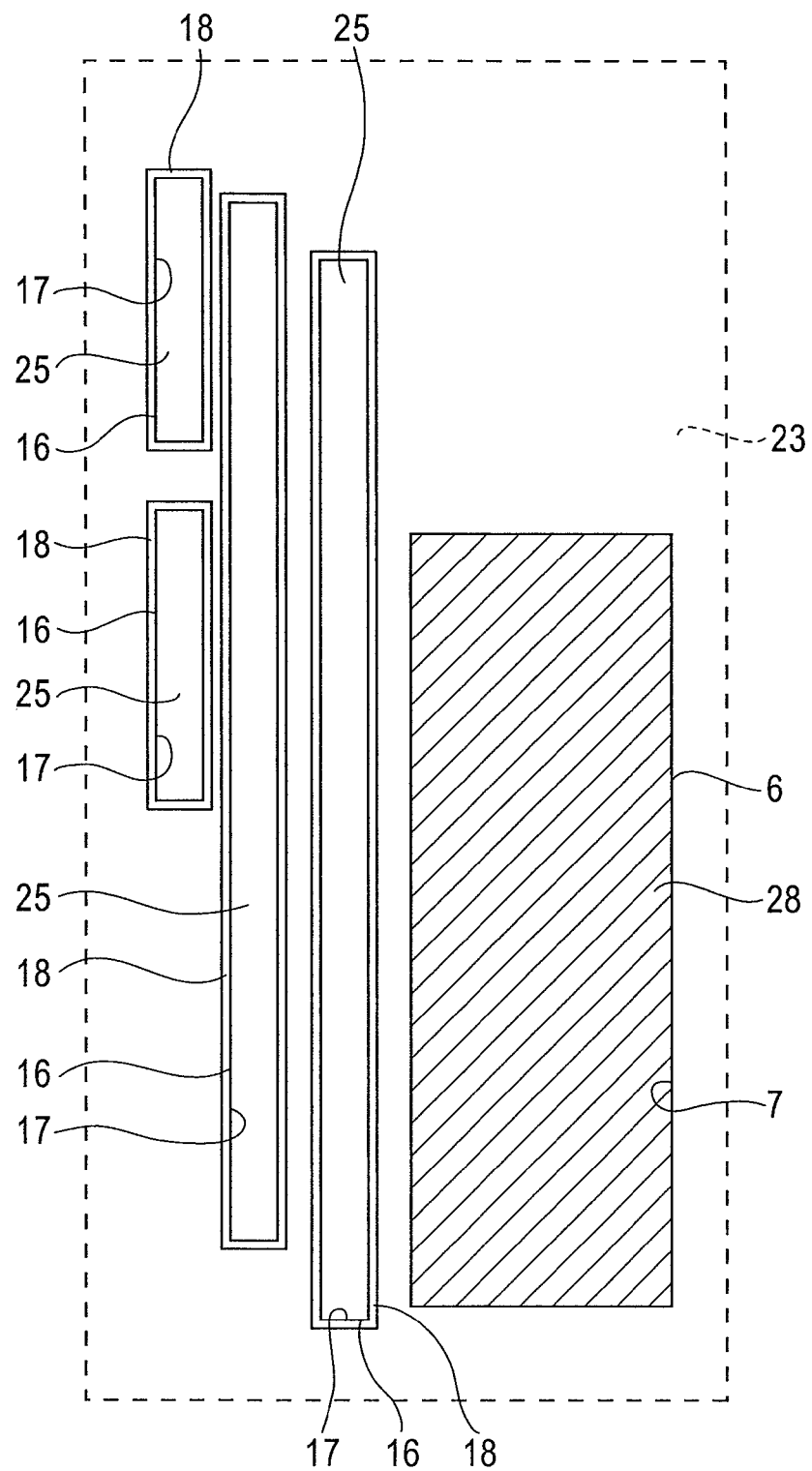
FIG. 14 is a top view for describing the manufacturing process of a sub-pixel for the organic EL display panel of the present invention.
Figure 15:
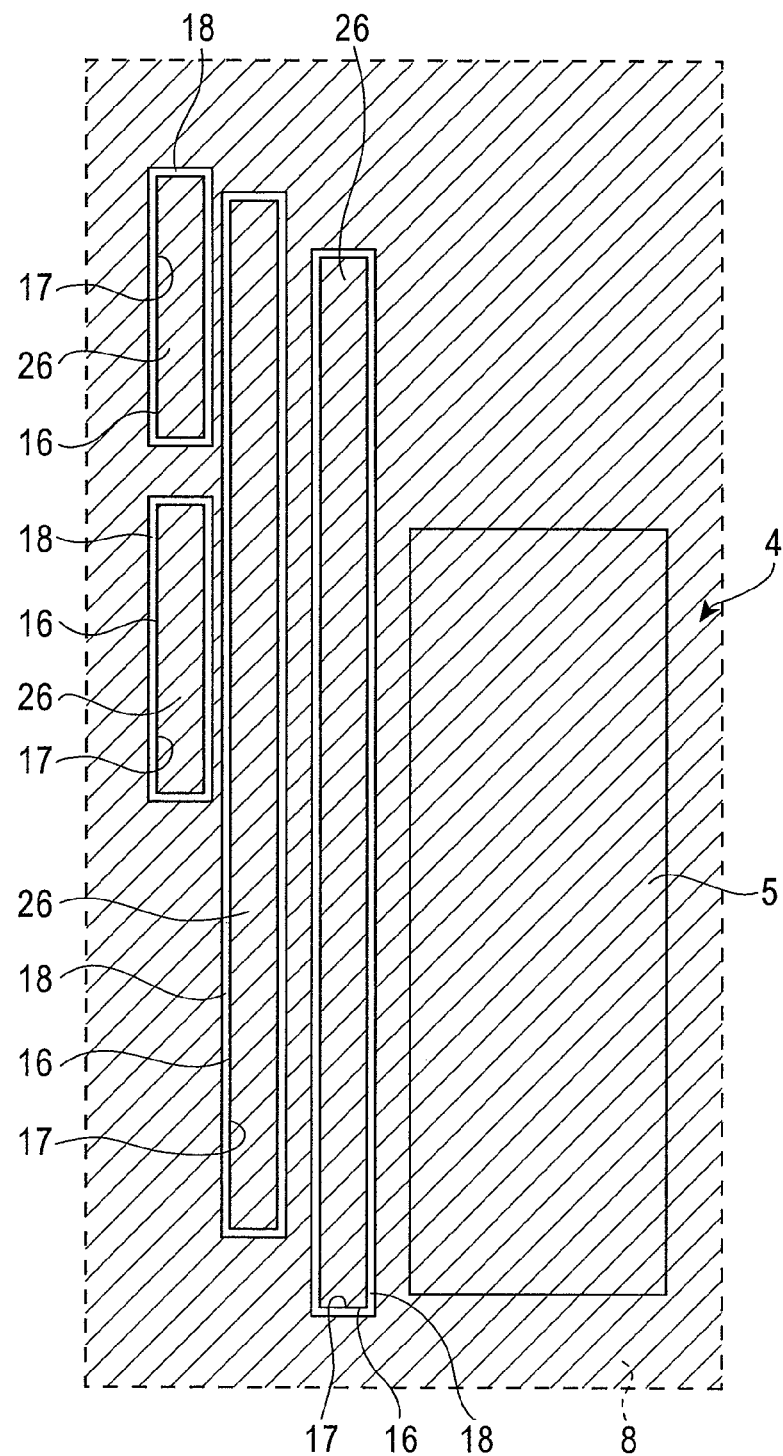
FIG. 15 is a top view for describing the manufacturing process of a sub-pixel for the organic EL display panel of the present invention.

As shown in FIG. 14, after the organic semiconductor layer 25 and the interlayer insulation film 36 are formed, the organic functional layer 28 (refer to FIG. 3) including the light emitting layer (not shown in the drawing) are formed in the light emitting region 6 on the first display electrode 27 using an inkjet method. Continuing, as shown in FIG. 15, the second display electrode 5 made from a conductive material such as metal is formed on the organic functional layer 28 using a vapor deposition method. The vapor deposition method is performed with the flow of vapor deposition material moving in a direction essentially perpendicular to the main surface of the substrate. Furthermore, the vapor deposition process forms a conductive material film on the first bank 23, forming an electrode connecting layer 8 that connects this thin film to the second display electrode 5. Note, in this vapor deposition process, the vapor deposition film 26 is formed from a metal material on the region encompassed by the second bank 18, or in other words on the interlayer insulation film 36, while the vapor deposition film 26 is isolated from the electrode connecting layer 8 by the second bank 18. In other words, as shown in FIG. 3, because the second bank 18 is protruding, the interval between the top region of the bank and the vapor deposition material and the interval between the top region of the second bank 18 and the electrode connecting layer 8 is separated in the direction perpendicular to the main surface of the substrate 2, and as a result, the vapor deposition film 26 is isolated from the electrode connecting layer 8. In other words, using the vapor deposition method which is an anisotropic film forming method and the second bank 18 which protrudes from the substrate 2, the electrode connecting layer 8 and the vapor deposition film 26 can positively be isolated at the side wall of the second bank 18. With the aforementioned vapor deposition process, the organic EL element 4 as shown in FIG. 13 is formed. Finally, sealing is performed using a dish-shaped sealing cap to complete the organic EL display device.

With the organic EL display device having organic TFT structure 14 as described above, emission of light from the organic EL element 4 was confirmed when the organic TFT (11 through 14) were driven.

With the organic EL display panel having the aforementioned construction, the second bank 18 is formed to protrude and to encompass the second window section 17, and therefore the second display electrode 5 of the organic EL element 4 and the organic semiconductor layer 25 of the organic TFT (11 through 14) can positively be isolated, and therefore current leak can be prevented from flowing therebetween. Furthermore, the organic semiconductor layer 25 can be prevented from spreading out from the transistor region 16 by forming the second bank 18. Generally, the organic semiconductor materials used for the organic semiconductor layer of an organic TFT has a charge mobility that is lower than that of inorganic semiconductor materials, and therefore the distance between the mutually counterfacing source electrode and drain electrode is large in order to form a definite channel between the source and drain electrodes. Furthermore, by increasing the contact area between the source/drain electrodes and the organic semiconductor layer, the channel can be more positive formed. Therefore, the thickness of the organic semiconductor layer is increased in order to increase the contact area with the source/drain electrodes. As a result, if the height of the bank which encompasses the organic TFT is low, the material which forms the organic semiconductor layer may possibly leak out from the region encompassed by the bank, but the organic semiconductor layer can be prevented from spreading out from the transistor region by forming the second bank.

Moreover, because the first bank 23 has a first and second window section (7, 17), the bank for the organic EL element and the bank for the organic TFT can be produced using the same process and the same materials, and therefore the manufacturing process can be simplified.

In the embodiment described above, Ta was used as the gate electrode, and Cr/Au as the source electrode and drain electrode, but those materials are not particularly limited as long as there is adequate conductivity. Specifically, a simple metal such as Pt, Au, W, Ru, Ir, Al, Sc, Ti, V, Mn, Fe, Co, Ni, Zn, Ga, Y, Zr, Nb, Mo, Tc, Rh, Pd, Ag, Cd, Ln, Sn, Ta, Re, Os, Tl, Pb, La, Ce, Pr, Nd, Pm, Sm, Eu, Gd, Tb, Dy, Ho, Er, Tm, Yb, Lu, or the like or a laminate or compound thereof may be used. Also, an organic conductive metal containing a conjugated polymer compound such as a metal oxide such as ITO or IZO, a polyaniline, a polythiophene, or a polypyrrole may be used.

Furthermore, while $Ta_2O_5$ produced by anodizing Ta as the gate electrode and as the gate insulating film is used in the embodiment described above, any anodizable metal is fine as the gate electrode material, and Al, Mg, Ti, Nb, Zr, and other single metals or a compound thereof may be anodized for the gate insulating film.

Furthermore, either an inorganic or organic insulating material may be used as the gate insulating film without using anodization. For example, metal oxides such as $LiO_x$, $LiN_x$, $NaO_x$, $KO_x$, $RbO_x$, $CsO_x$, $BeO_x$, $MgO_x$, $MgN_x$, $CaO_x$, $CaN_x$, $SrO_x$, $BaO_x$, $ScO_x$, $YO_x$, $YN_x$, $LaN_x$, $CeO_x$, $PrO_x$, $NdO_x$, $SmO_x$, $EuO_x$, $GdO_x$, $TbO_x$, $DyO_x$, $HoO_x$, $ErO_x$, $TmO_x$, $YbO_x$, $LuO_x$, $TiO_x$, $TiN_x$, $ZrO_x$, $ZrN_x$, $HfO_x$, $HfN_x$, $ThO_x$, $VO_x$, $VN_x$, $NbO_x$, $TaO_x$, $TaN_x$, $CrO_x$, $CrN_x$, $MoO_x$, $MoN_x$, $WO_x$, $WN_x$, $MnO_x$, $ReO_x$, $FeO_x$, $FeN_x$, $RuO_x$, $OsO_x$, $CoO_x$, $RhO_x$, $IrO_x$, $NiO_x$, $PdO_x$, $PtO_x$, $CuO_x$, $CuN_E$, $AgO_x$, $AuO_x$, $ZnO_x$, $CdO_x$, $HgO_x$, $BP_x$, $BN_x$, $ALO_x$, $AlN_x$, $GaO_x$, $GaN_x$, $InO_x$, $TiO_x$, $TiN_x$, $SiN_x$, $GeO_x$, $SnO_x$, $PbO_x$, $PD_x$, $PN_x$, $AsO_x$, $SbO_x$, $SeO_x$, and $TeO_x$; metal compounds such as $LiAlO_2$, $Li_2SiO_3$, $Li_2TiO_3$, $Na_2Al_{22}O_{34}$, $NaFeO_2$, $Na_4SiO_4$, $K_2SiO_3$, $K_2TiO_3$, $K_2WO_4$, $Rb_2CrO_4$, $Cs_2CrO_4$, $MgAl_2O_4$, $MgFe_2O_4$, $MgTiO_3$, $CaTiO_3$, $CaWO_4$, $CaZrO_3$, $SrFe_{12}O_{19}$, $SrTiO_3$, $SrZrO_3$, $BaAl_2O_4$, $BaFe_{12}O_{19}$, $BaTiO_3$, $Y_3Al_5O_{12}$, $Y_3Fe_5O_{12}$, $LaFeO_3$, $La_3Fe_5O_{12}$, $La_2Ti_2O_7$, $CeSnO_4$, $CeTiO_4$, $Sm_3Fe_5O_{12}$, $EuFeO_3$, $Eu_3Fe_5O_{12}$, $GdFeO_3$, $Gd_3Fe_5O_{12}$, $DyFeO_3$, $Dy_3Fe_5O_{12}$, $HoFeO_3$, $Ho_3Fe_5O_{12}$, $ErFeO_3$, $Er_3Fe_5O_{12}$, $Tm_3Fe_5O_{12}$, $LuFeO_3$, $Lu_3Fe_5O_{12}$, $NiTiO_3$, $Al_2TiO_3$, $FeTiO_3$, $BaZrO_3$, $LiZrO_3$, $MgZrO_3$, $HfTiO_4$, $NH_4VO_3$, $AgVO_3$, $LiVO_3$, $BaNb_2O_6$, $NaNbO_3$, $SrNb_2O_6$, $KTaO_3$, $NaTaO_3$, $SrTa_2O_6$, $CuCr_2O_4$, $Ag_2CrO_4$, $BaCrO_4$, $K_2MoO_4$, $Na_2MoO_4$, $NiMoO_4$, $BaWO_4$, $Na_2WO_4$, $SrWO_4$, $MnCr_2O_4$, $MnFe_2O_4$, $MnTiO_3$, $MnWO_4$, $CoFe_2O_4$, $ZnFe_2O_4$, $FeWO_4$, $CoMoO_4$, $CuTiO_3$, $CuWO_4$, $Ag_2MoO_4$, $Ag_2WO_4$, $ZnAl_2O_4$, $ZnMoO_4$, $ZnWO_4$, $CdSnO_3$, $CdTiO_3$, $CdMoO_4$, $CdWO_4$, $NaAlO_2$, $MgAl_2O_4$, $SrAl_2O_4$, $Gd_3Ga_5O_{12}$, $InFeO_3$, $MgIn_2O_4$, $Al_2TiO_5$, $FeTiO_3$, $MgTiO_3$, $Na_2SiO_3$, $CaSiO_3$, $ZrSiO_4$, $K_2GeO_3$, $Li_2GeO_3$, $Na_2GeO_3$, $Bi_2Sn_3O_9$, $MgSnO_3$, $SrSnO_3$, $PbSiO_3$, $PbMoO_4$, $PbTiO_3$, $SnO_2\text{-}Sb_2O_3$, $CuSeO_4$, $Na_2SeO_3$, $ZnSeO_3$, $K_2TeO_3$, $K_2TeO_4$, $Na_2TeO_3$, and $Na_2TeO_4$; sulfides such as FeS, $Al_2S_3$, MgS, and ZnS; fluorides such as LiF, $MgF_2$, and $SmF_3$; chlorides such as HgCl, $FeCl_2$, and $CrCl_3$; bromides such as AgBr, CuBr, and $MnBr_2$; iodides such as $PbI_2$, CuI, and $FeI_2$; and metal oxide nitrides such as SiAlON are effective as well. Polymer materials such as polyimides, polyamides, polyesters, polyacrylates, epoxy resins, phenol resins, and polyvinyl alcohols are also effective. Also, the gate insulating film surface may be hydrophobically treated with OTS (octadecyltrichlorosilane), HMDS (hexamethyldisilazane), or the like.

Furthermore, in the above embodiment, a fluorine based light sensitive resin was used as the bank material, but any material with high insulation properties may be used regardless of being organic or inorganic. Furthermore, the aforementioned embodiment used photolithography technology that used a photosensitive resin, but for instance a dry process which uses reactive ion etching (RIE) may also be used. Furthermore, the bank material is preferably a water repellent material, but treating the bank surface to provide water repellency after forming the bank is also acceptable.

Furthermore, the material of the first bank and the material of the second bank may be the same material. By using the same material, the number of materials used to make the organic EL display panel will be reduced, and manufacturing costs can be reduced.

Furthermore, although P3HT was used as the organic semiconductor material of the organic TFTs in the embodiment described above, it is not limited thereto, and an organic material showing semiconductor characteristics is fine. For example, a polymer material in which the structure of the low molecular compound described above is used in the main chain of a polymer such as a polyethylene chain, a polysiloxane chain, a polyether chain, a polyester chain, a polyamide chain, or a polyimide chain or joined into a pendant form as a side chain; or a carbon-based conjugated polymer such as a composite conjugated polymer having a structure in which constituent units of an aromatic conjugated polymer such as polyparaphenylene, an aliphatic conjugated polymer such as polyacetylene, a heterocyclic conjugated polymer such as a polypyrrole or polythiophene, a heteroatom containing conjugate polymer such as a polyaniline or polyphenylene sulfide, or a conjugated polymer such as poly(phenylenevinylene), poly(anilinevinylene), or poly(thiolinevinylene) are alternately joined may be used. Also, a polymer wherein a carbon-based conjugated structure and an oligosilane with a disilanylene carbon-based conjugated polymer structure such as a polysilane, a disilanylene arylene polymer, a (disilanylene)ethenylene polymer, or a (disilanylene)ethynylene polymer are alternately chained may be used. In addition, a polymer chain comprising an inorganic element such as phosphorous or nitrogen is fine; a polymer in which the aromatic-based ligand of a polymer chain is coordinated such as phthalocyanate polysiloxane, a polymer wherein a perylene is annulled with heat treatment such as perylenetetracarboxylic acid, a ladder polymer obtained by heat treating a polyethylene derivative having a cyano group such as polyacrylonitrile, or a composite material in which an organic compound is intercalated in a perovskite may be used. Also, a phthalocyanine derivative; a naphthalocyanine derivative; an azo compound derivative; a perylene derivative; an indigo derivative; a quinacridone derivative; an anthraquinone or other such polycyclic quinone derivative; a cyanine derivative; a fullerene derivative; a nitrogen-containing polycyclic compound derivative such as indole, carbazole, oxazole, isoxazole, thiazole, imidazole, pyrazol, oxadiazole, pyrazoline, thiathiazole, or triazole; a hydrazine derivative; a triphenylamine derivative; a triphenylmethane derivative; stilbene; anthraquinone diphenoquinone or another such quinone compound derivative; a polycyclic aromatic compound derivative such as anthracene, bilene, phenanthrene, or coronene; or the like is fine; and a material soluble in a solvent such as when furnishing a functional group is fine.

Although the organic EL element was described in the embodiment above as a bottom emission type element for externally extracting light via the first display electrode and substrate, it is not limited thereto, and a top emission type element for externally extracting light via the second display electrode is also fine.

Figure 16:
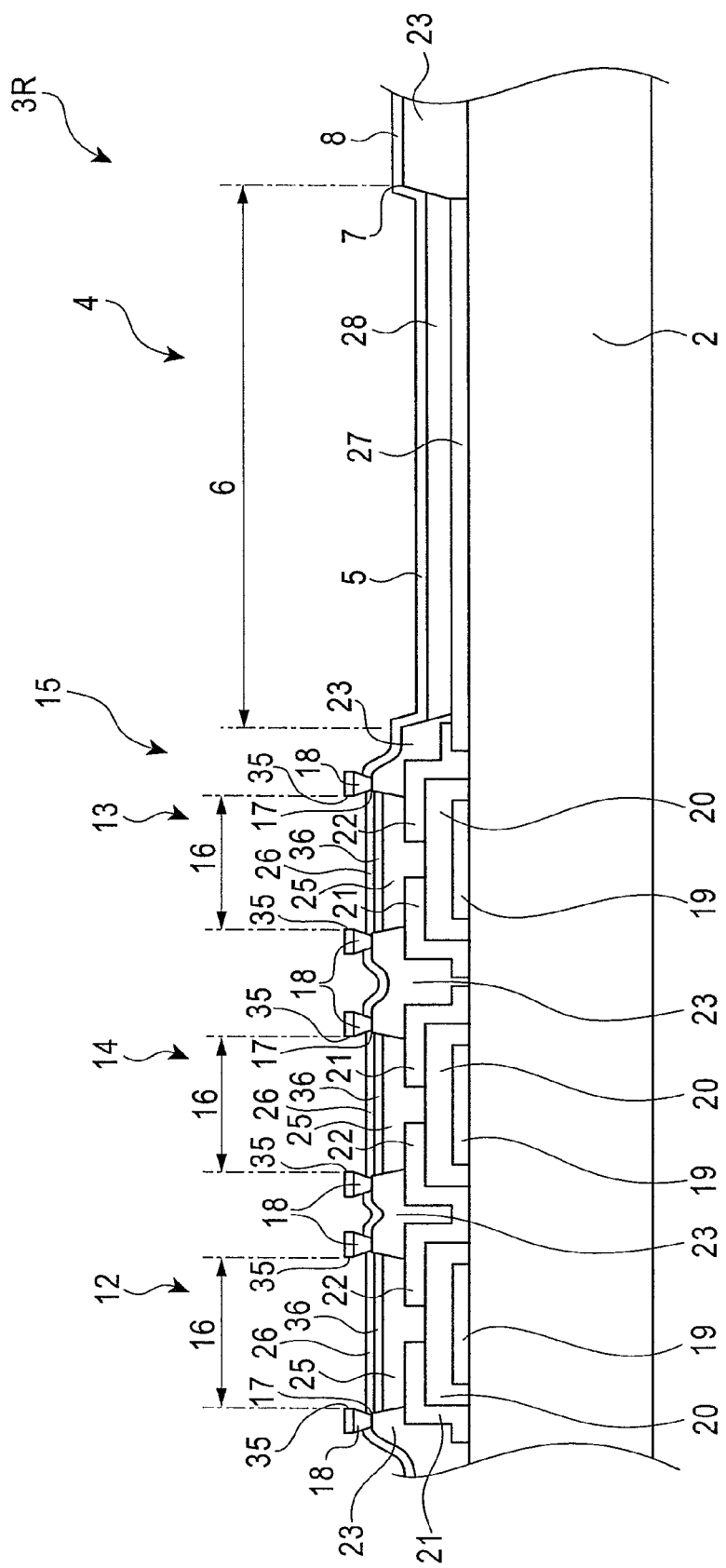
FIG. 16 is a cross-section view showing an alternate example of a sub-pixel for the organic EL display panel of the present invention.

As an alternate, an organic EL display panel with the construction shown in FIG. 16 will be described. FIG. 16 is a cross-section view of a sub-pixel 3R for an organic EL display panel. The transistor region 16 where the organic semiconductor layer 25 is located in the organic TFT (11 through 14) is demarcated by the second window section 17 of the first bank 23, and the second bank 18 protrudes in a direction that intersects with the main surface of the substrate 2 on the perimeter of the second window section 17. An overhanging part 35 which protrudes in a direction parallel with the main surface of the substrate is provided on the top part of the second bank 18. Therefore the cross-sectional shape of the second bank has a reversed taper shape with the width at the bottom being narrower than the width at the top, with the width gradually increasing from the bottom part to the top part. The rest of the construction is essentially the same as the aforementioned embodiment. By forming an overhanging part 35 on the top part of the second bank 18, a gap will be formed between the edge of the top part of the second bank 18 and the first bank and/or the source/drain electrodes. The electrode deposition film of the conductive material can be separated in the perpendicular direction by this gap. In other words, the vapor deposition film 26 at the top part of the second bank and the vapor deposition film 26 above the interlayer insulating film 36 and the electrode connecting layer 8 can definitely be separated. In other words, because the second bank has this gap, the second display electrode 5 of the organic EL element 4 is positively separated from the organic semiconductor layer 25 of the organic TFT (11 through 14) and can therefore be mutually isolated.

The organic EL display panel of the present invention comprises a substrate, an organic EL element comprising in order from the substrate, a first display electrode, an organic functional layer, and a second display electrode, and an organic TFT for driving and controlling the organic EL element, comprising in order from the substrate a gate electrode, a gate insulation film, source/drain electrodes, and an organic semiconductor layer, the organic EL display panel further comprising: a first bank having a first window section for demarcating a light emitting region containing the organic functional layer on the first display electrode and a second window section demarcating a transistor region containing the organic semiconductor layer between the source/drain electrodes; and a second bank located in the perimeter of the second window section and protruding in a direction that intersects with the main surface of the substrate, and therefore the second display electrode of the organic EL element and the organic semiconductor layer of the organic TFT can positively be separated by the second bank, and the occurrence of current leak at the organic TFT can be prevented.

The organic EL display panel manufacturing method of the present invention is a manufacturing method for an organic EL display panel comprising a substrate, an organic EL element comprising in order from the substrate, a first display electrode, an organic functional layer, and a second display electrode, and an organic TFT for driving and controlling the organic EL element, comprising in order from the substrate a gate electrode, a gate insulation film, source/drain electrodes, and an organic semiconductor layer, the organic EL display panel manufacturing method comprising the steps of: forming the gate electrode and the first display electrode on the substrate; forming the gate insulation film on the gate electrode; forming the source/drain electrodes on the gate insulation film, mutually separated and counterfacing; forming a first bank having a first window section demarcating a region for light emission that contains the organic functional layer on the first display electrode, and a second window section demarcating the transistor region that contains the organic semiconductor layer between the source/drain electrodes; forming a second bank located in the perimeter of the second window section and protruding in a direction that intersects with the main surface of the substrate; forming the organic semiconductor layer in the second window section; forming the organic functional layer in the first window section; and forming the second display electrode using a vapor deposition method on the organic functional layer, and therefore the second display electrode of the organic EL elements and the organic semiconductor layer of the organic TFT can positively be separated by the second bank, and the occurrence of the current leak at the organic TFT can be prevented, and the material which composes the organic semiconductor layer can be prevented from spreading from the transistor region.

The invention claimed is:

1. An organic electroluminescent display panel, comprising:
   a substrate;
   an organic electroluminescent element comprising in order from the substrate, a first display electrode, an organic functional layer; and
   a second display electrode, and an organic thin film transistor for driving and controlling the organic electroluminescent element comprising in order from the substrate, a gate electrode, a gate insulation film, source/drain electrodes, and an organic semiconductor layer,
   the organic electroluminescent display panel, further comprising:
   a first bank having a first window section for demarcating a light emitting region on which the organic functional layer is provided on the first display electrode, and a second window section demarcating a transistor region on which the organic semiconductor layer is provided between the source/drain electrodes; and
   a second bank located in the perimeter of the second window section and protruding in a direction that intersects with the main surface of the substrate.

2. The organic electroluminescent display panel according to claim 1, wherein the second bank has a side wall surface that is substantially parallel to the perpendicular plane of the main surface of the substrate.

3. The organic electroluminescent display panel according to claim 1, having an overhang part that protrudes in a direction parallel to the main surface of the substrate on the top part of the second bank.

4. The organic electroluminescent display panel according to claim 1, wherein the first bank and the second bank comprise the same material.

5. A manufacturing method for an organic electroluminescent display panel having: a substrate; an organic electroluminescent element comprising in order from the substrate, a first display electrode, an organic functional layer, and a second display electrode; and an organic thin film transistor for driving and controlling the organic electroluminescent element comprising in order from the substrate a gate electrode, a gate insulation film, source/drain electrodes, and an organic semiconductor layer, the manufacturing method comprising the steps of:
   forming the gate electrode and the first display electrode on the substrate;
   forming the gate insulation film on the gate electrode;
   forming the source/drain electrodes to be mutually separated and oppose one another on the gate insulation film;
   forming a first bank having a first window section demarcating a region for light emission on which the organic functional layer is provided on the first display electrode, and a second window section demarcating the transistor region on which the organic semiconductor layer is provided between the source/drain electrodes;
   forming a second bank located in the perimeter of the second window section and protruding in a direction that intersects with the main surface of the substrate;

forming the organic semiconductor layer in the second window section;

forming the organic functional layer in the first window section; and forming the second display electrode using a vapor deposition method on the organic functional layer.

6. The manufacturing method for an organic electroluminescence display panel according to claim 5, wherein the step of forming the second bank is a step of forming a side wall surface that is substantially parallel to the perpendicular plane of the main surface of the substrate.

7. The manufacturing method for an organic electroluminescence display panel according to claim 5, wherein the step of forming the second bank is a step of forming an overhang part that protrudes in a direction parallel to the main surface of the substrate on the top part of the second bank.

8. The manufacturing method for an organic electroluminescence display panel according to claim 5, wherein the step of forming the organic semiconductor layer is a step of forming the organic semiconductor layer in the transistor region using an inkjet method.

9. The manufacturing method for an organic electroluminescence display panel according to claim 5, wherein the step of forming the organic functional layer is a step of forming the organic functional layer in the light emitting region using an inkjet method.

* * * * *